(12) United States Patent
Lopata

(10) Patent No.: US 6,509,722 B2
(45) Date of Patent: Jan. 21, 2003

(54) DYNAMIC INPUT STAGE BIASING FOR LOW QUIESCENT CURRENT AMPLIFIERS

(75) Inventor: Douglas D. Lopata, Boyertown, PA (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 09/846,844

(22) Filed: May 1, 2001

(65) Prior Publication Data

US 2002/0171403 A1 Nov. 21, 2002

(51) Int. Cl.$^7$ ................................................ G05F 1/40
(52) U.S. Cl. ........................ 323/280; 323/275; 323/285; 330/290; 330/296; 330/130
(58) Field of Search ................................. 323/265, 266, 323/268, 273–275, 277, 280, 311–314, 349, 350, 907; 330/270, 273, 285, 288, 290, 296, 129, 130

(56) References Cited

U.S. PATENT DOCUMENTS 5,939,867 A * 8/1999 Capici et al. ............... 323/277
6,046,640 A * 4/2000 Brunner ...................... 330/254
6,157,176 A * 12/2000 Pulvirenti et al. .......... 323/266
6,246,221 B1 * 6/2001 Xi .............................. 323/280

OTHER PUBLICATIONS

A.B. Grebene, "Bipolar and MOS Analog Integrated Circuit Design," John Wiley & Sons, pp. 481–514, 1984.

* cited by examiner

Primary Examiner—Robert E. Nappi
Assistant Examiner—Gary L. Laxton
(74) Attorney, Agent, or Firm—Ryan, Mason & Lewis, LLP

(57) ABSTRACT

An amplifier, for use in regulator circuits and other applications, having dynamic input stage biasing includes an input stage operatively coupled to an input of the amplifier. A controlled current source coupled to the input stage is responsive to a control signal for at least partially controlling an input bias current generated by the controlled current source. The amplifier further includes a sense circuit operatively connected in a feedback arrangement between an output of the amplifier and the controlled current source. The sense circuit measures an output load current from the amplifier and generates the control signal in response thereto, whereby the input bias current is a function of the output load current of the amplifier. In this manner, parasitic poles associated with the amplifier are pushed out in frequency so as to provide superior amplifier stability while dissipating low quiescent current, particularly at low output load current levels.

28 Claims, 5 Drawing Sheets

300

400

DYNAMIC INPUT STAGE BIASING FOR LOW QUIESCENT CURRENT AMPLIFIERS

FIELD OF THE INVENTION

The present invention relates generally to amplifier circuits for use in regulator circuits and other applications, and more particularly relates to amplifiers having dynamic input stage biasing for minimized quiescent current operation.

BACKGROUND OF THE INVENTION

Regulator circuits are well known for providing a specified and constant output voltage or current from a poorly defined and often fluctuating input voltage or current. The regulation and control of supply voltage, particularly under changing load conditions, is perhaps one of the most fundamental and critical requirements of any electronic system design. For this reason, monolithic voltage regulator or power control circuits are considered to be among the essential building blocks of any analog or digital system.

FIG. 1 illustrates a simplified block diagram depicting a conventional linear series regulator circuit 100. With reference to FIG. 1, the basic series regulator is a feedback circuit comprised of three primary sub-circuits, namely, a reference voltage generator 102, an error amplifier 104 and a pass element 106. The reference voltage generator 102 generates a reference voltage $V_R$ that is substantially independent of both the unregulated supply voltage $V_{IN}$ to which the reference voltage generator is connected, and temperature variations. The error amplifier 104 compares the reference voltage $V_R$ with a measured voltage $V_S$ which represents a scaled version of a regulated output voltage $V_O$ of the regulator. This scaled voltage $V_S$ is typically derived from a simple tapped resistive divider, for example comprised of resistors $R_1$ and $R_2$ connected in series across the output $V_O$. Error amplifier 104 generates an error output signal at node 108 which is coupled to the pass element 106 for regulating a voltage drop across the pass element 106 such that the scaled voltage $V_S$ is held substantially equal to the reference voltage $V_R$. A more detailed discussion of regulator circuit fundamentals is presented, for example, in the text A. B. Grebene, *Bipolar and MOS Analog Integrated Circuit Design*, John Wiley & Sons, pp. 481–514 (1984), which is incorporated herein by reference.

In many conventional regulator implementations, a high-current p-channel metal-oxide-semiconductor (PMOS) transistor device (not shown) is employed as the series-pass element 106. The gate terminal of the PMOS device, in this instance, is coupled to the output of the error amplifier, the source terminal of the PMOS device is coupled to the unregulated input $V_{IN}$ and the drain terminal of the PMOS device forms the regulated output node $V_O$. The resistance of the PMOS device, and hence the voltage drop across the device, is controlled by the error output signal generated by the error amplifier 104 to regulate the output voltage $V_O$ as stated above.

For very low output current levels, the loop bandwidth of a feedback circuit is primarily dominated by a large external capacitance $C_{BYP}$ (and equivalent series resistance $R_{ESR}$, which is typically on the order of one microfarad (1 μF), and an effective output resistance $R_O$ of the regulator. The combination of $C_{BYP}$ and $R_O$ results in a pole being formed which creates a 3-dB rolloff in the range of several hertz or less. The resulting rapid rolloff of gain at higher frequencies can significantly degrade certain performance characteristics of the regulator, such as, for example, ripple rejection (which is a measure of the regulator's ability to reject periodic fluctuations of rectified ac voltage signals at the input of the regulator).

For sensitive integrated circuit applications, such as, for example, voltage-controlled oscillators (VCOs) and radio frequency (RF) circuits typically found in cellular telephones, amplifier-based linear regulators must provide efficiently regulated output voltages while supplying output currents that can vary by five or six orders of magnitude, or more. A fundamental objective in such applications is that of providing stable and fast regulator performance over this wide dynamic load current range. Furthermore, it is desirable to provide such stability and response while dissipating a minimum quiescent current when little or no load current is being drawn.

Various techniques and circuit arrangements have been conventionally employed in an attempt to solve the above problems, including, for example, dynamic source/emitter biasing at the output stage of the error amplifier, specifying tight restrictions on output capacitor size and equivalent series resistance ($R_{ESR}$) associated with the output capacitor $C_{BYP}$, incorporating multiple amplifiers in the regulating/feedback path to handle dc and ac signal paths, and increasing feedback amplifier quiescent current to improve stability and dynamic response. These conventional approaches to solving the above problems, however, typically require more quiescent current, higher cost components, and/or more silicon area, all resulting in poorer overall performance.

Accordingly, there exists a need for an amplifier circuit, for use in regulator circuits and other applications, that is capable of providing superior stability and dynamic response across a full range of load current and load capacitance values, while dissipating a minimized quiescent current during low output current operation.

SUMMARY OF THE INVENTION

The present invention provides an amplifier, for use in regulator circuits and other applications, which dissipates a minimized quiescent current at low output current operation while providing enhanced stability and dynamic response across a wide range of load currents and load capacitance values. The invention employs a dynamic input stage biasing architecture, whereby input stage bias current is operatively controlled as a function of output load current, thereby increasing the bandwidth of the amplifier as load current increases. In this manner, parasitic poles associated with the amplifier are pushed out in frequency so as not to compromise amplifier stability, particularly at low output load current levels, as the dominant pole formed by the amplifier output impedance and output bypass capacitance increases with increased load current.

In accordance with one aspect of the invention, an amplifier having dynamic input stage biasing includes an input stage operatively coupled to an input of the amplifier. A controlled current source is coupled to the input stage and is responsive to a control signal for at least partially controlling an input bias current generated by the controlled current source. The amplifier further includes a sense circuit which is operatively connected in a feedback arrangement between an output of the amplifier and the controlled current source. The sense circuit measures an output load current from the amplifier and generates the control signal in response thereto. In this manner, the input bias current, as well as the amplifier bandwidth, is a function of the output load current of the amplifier.

These and other features and advantages of the present invention will become apparent from the following detailed description of illustrative embodiments thereof, which is to be read in connection with the accompanying drawings.

DETAILED DESCRIPTION OF THE PREFERRED EMBODIMENT

The present invention will be described herein in the context of an illustrative series regulator circuit. It should be appreciated, however, that the present invention is not limited to this or any particular regulator circuit. Rather, the invention is more generally applicable to any amplifier circuit in which low quiescent current operation is desirable while maintaining the stability and dynamic response of the circuit across a wide range of load current and load capacitance values. Moreover, although implementations of the present invention are described herein using complimentary metal-oxide-semiconductor (CMOS) devices, it is to be appreciated that the invention is not limited to such devices, and that other suitable devices, such as, for example, bipolar junction transistor (BJT) devices, may be similarly employed, with or without modifications to the circuit, as understood by those skilled in the art. Furthermore, one skilled in the art will appreciate that the present invention may be similarly implemented using devices having a polarity opposite to those depicted in the figures (e.g., NMOS transistors substituted for PMOS transistors, and vice versa).

Figure 1:
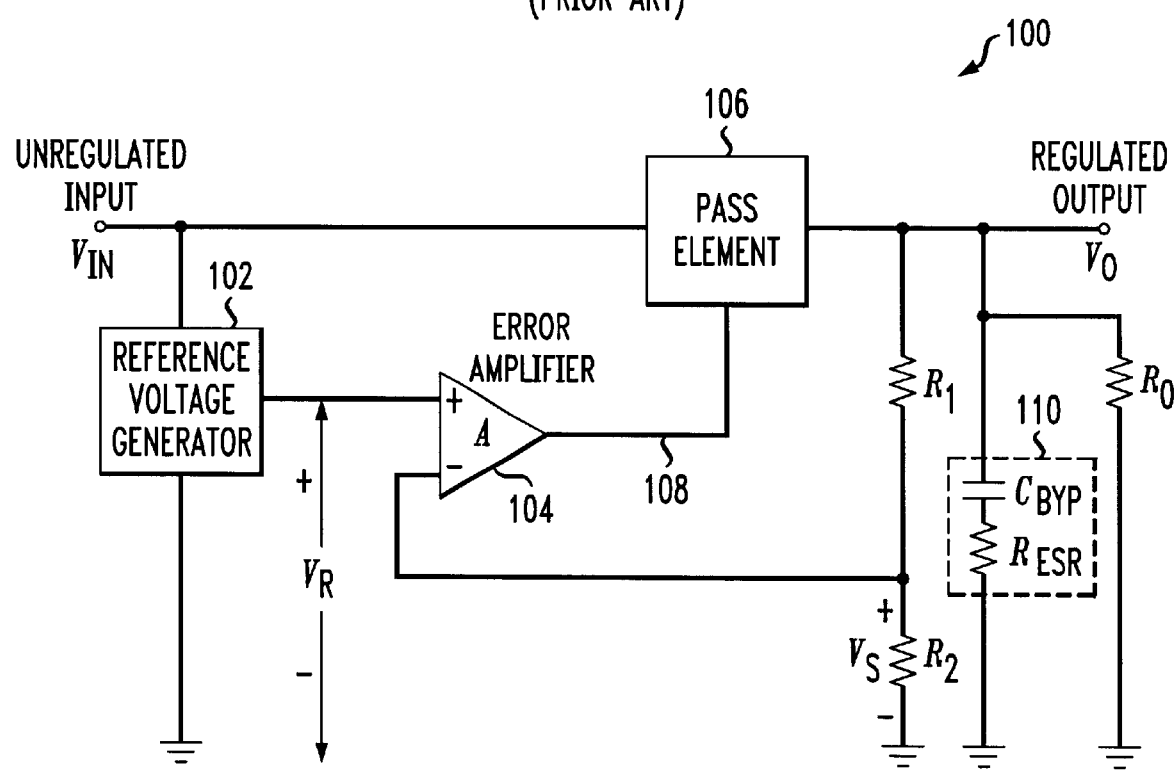
FIG. 1 is a schematic diagram illustrating a conventional series regulator circuit.
Figure 2:
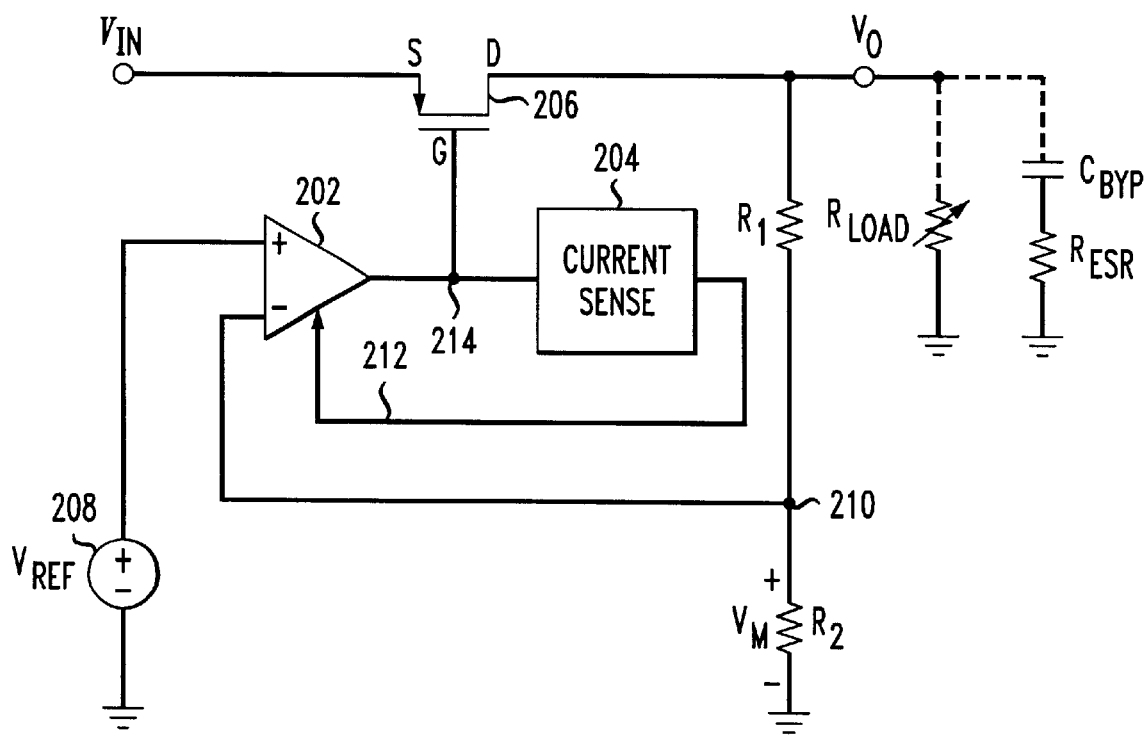
FIG. 2 is a schematic diagram depicting an illustrative regulator circuit, formed in accordance with the present invention.

Without loss of generality, FIG. 2 depicts a series regulator circuit 200 employing dynamic input stage biasing in accordance with one aspect of the invention. The illustrative regulator circuit 200 includes an error amplifier 202, a current sense circuit 204, and a pass element implemented as a PMOS transistor device 206. The pass transistor 206 is connected so that its source terminal (S) is coupled to the unregulated input $V_{IN}$ and the drain terminal (D) forms a regulated output $V_O$ of the regulator circuit 200. A tapped voltage divider, for example comprised of two or more resistors R1 and R2 connected in a series configuration, is coupled between the drain terminal of the pass transistor 206 and circuit ground and may be used for providing a current sink path for transistor 206 (e.g., as a load or pull-down) in addition to measuring a predetermined portion of the output $V_O$. Alternatively, it is contemplated that the voltage divider may be implemented using one or more active devices (e.g., a transistor biased to an appropriate quiescent point), either in place of or in addition to the one or more resistors in the voltage divider, as will be understood by those skilled in the art. The external regulator load may be represented as a load resistor $R_{LOAD}$ and a load capacitor $C_{BYP}$ (having an equivalent series resistance $R_{ESR}$ associated therewith) coupled together in parallel across the output $V_O$ of the regulator circuit. The load resistor $R_{LOAD}$ is depicted as a variable resistance element to represent the wide range of output load current which the regulator circuit may be required to supply.

The error amplifier 202 is preferably a differential amplifier, such as, for example, an operational amplifier, having a non-inverting or positive input (+), an inverting or negative input (−) and an output coupled to a gate terminal (G) of the pass transistor 206 at node 214. The error amplifier 202 preferably compares a measured voltage $V_M$ (e.g., developed across resistor R2 of the voltage divider), coupled to the inverting input of the error amplifier at node 210 with a reference voltage $V_{REF}$ (e.g., generated by a voltage source 208 which is ideally independent of the unregulated supply), coupled to the non-inverting input of the error amplifier, and generates a corrective error signal at the output of the error amplifier. An effective impedance, and hence voltage drop, of the pass device 206 is modulated by the corrective error signal from the error amplifier 202 such that the output $V_O$ of the regulator circuit is held at a substantially constant predefined voltage, regardless of the input voltage $V_{IN}$. The measured voltage $V_M$ is derived from the regulated output $V_O$ by means of a resistive divider comprising series-connected resistors R1 and R2, as explained above. In this manner, a feedback loop is established around the error amplifier. It is to be appreciated that the input connections to the error amplifier 202 may be reversed, in which case the polarity type of the pass transistor 206 could likewise be reversed (e.g., NMOS device) and the transistor would be used in a follower arrangement thereby avoiding a positive feedback condition, as will be understood by those skilled in the art.

The error amplifier 202 further includes at least one bias control input for receiving at least one control signal, e.g., via line 212, and operatively controlling an input bias current of the error amplifier in response thereto. Details of an illustrative error amplifier formed in accordance with the invention will be described below in conjunction with FIGS. 3 and 4.

With continued reference to FIG. 2, the current sense circuit 204 is operatively coupled to the output 214 of the error amplifier 202. The current sense circuit 204 monitors an output voltage or current produced by the error amplifier 202 and generates the control signal on line 212 in response thereto. The control signal generated by the current sense circuit 204 is preferably fed back to the bias control input of the error amplifier 202 for dynamically controlling an input stage bias current in the error amplifier, preferably in proportion to the sensed output voltage or current produced by the error amplifier. Control signal 212 may be in the form of a predetermined portion of output current generated by the error amplifier. In this instance, as the output load current from the error amplifier 202 increases, the amount of current being fed back to the error amplifier increases proportionally.

By way of example only, the control signal 212 from the current sense circuit 204 can be summed with a current produced by a bias generator (not shown) in the error amplifier 202 so as to generate an input bias current for the input stage of the error amplifier that is a function of the output load current from the regulator circuit. In this manner, as the load current increases, the amount of current being fed back to the input stage of the error amplifier increases, thus providing a dynamic input stage biasing which increases the bandwidth of the input stage of the error amplifier with increasing output load current, while maintaining a low quiescent current in the regulator circuit 200 when little or no output current is being drawn. This novel input stage biasing architecture provides superior stability, particularly at low output load current levels. As understood by those skilled in the art, other suitable voltage-dependent or current-dependent current source architectures may be similarly employed with the present invention in accordance with the principles set forth herein.

It is to be appreciated that the effective bandwidth of the regulator circuit 200 increases with increasing output load current, due, to a large extent, to an increase in small signal transconductance characteristics (e.g., $g_m$ and $g_o$) associated with transistor devices comprising the error amplifier 202. Consequently, since the parasitic capacitances of the transistor devices increase with increasing load current, and since the value of load capacitance remains essentially constant, the parasitic poles of the error amplifier become significantly more influential in determining an overall loop stability of the regulator circuit. Additionally, since the output impedance of the regulator circuit decreases with increasing output load current, the pole formed by the output capacitance and the output impedance of the regulator is pushed farther out in frequency. Hence, this pole can no longer be considered a dominant pole compared to other parasitic poles in the regulator circuit.

Figure 3:
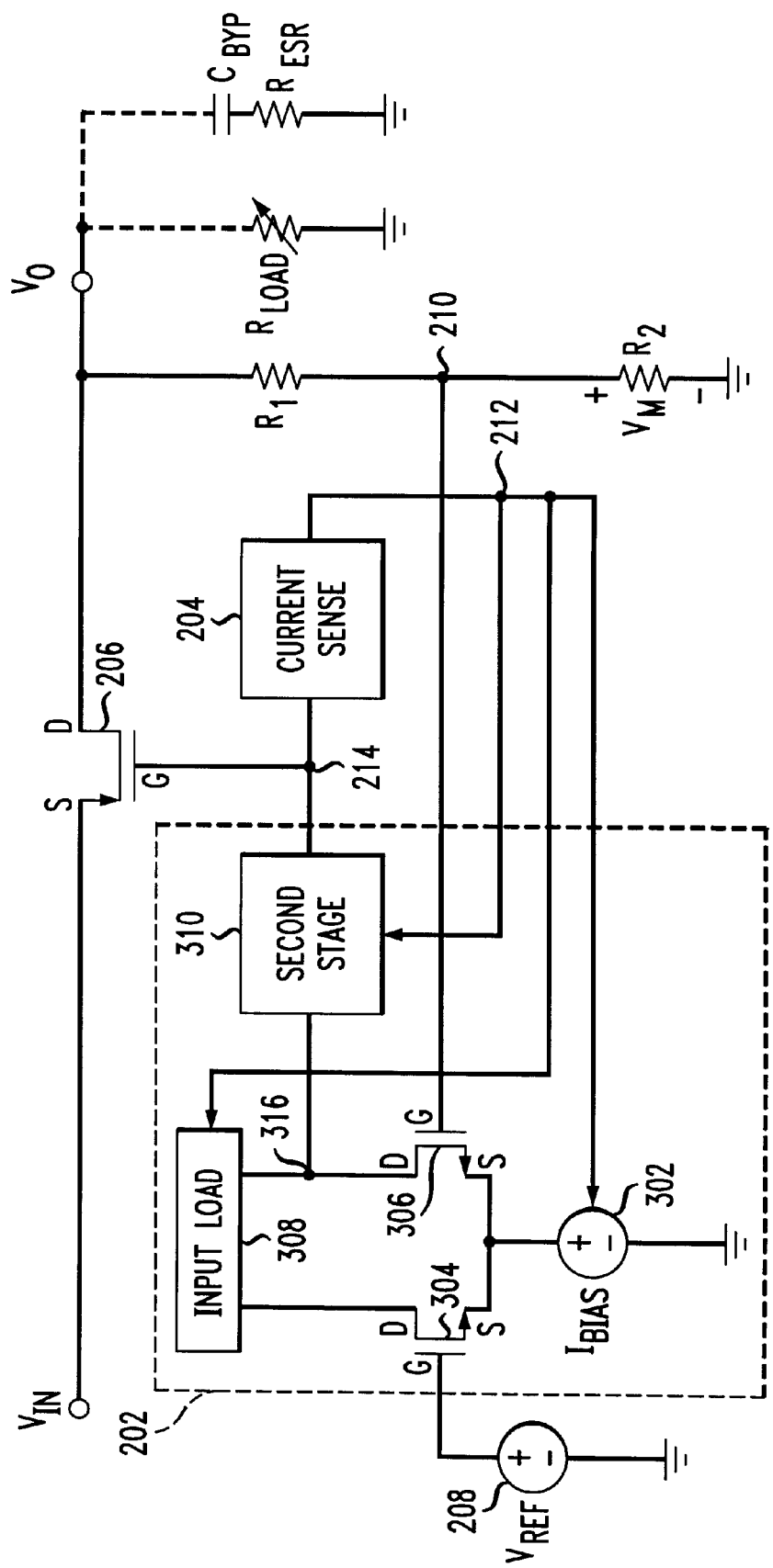
FIG. 3 is a schematic diagram depicting details of the error amplifier of the illustrative regulator circuit shown in FIG. 2, formed in accordance with the present invention.

With reference now to FIG. 3, details of an illustrative error amplifier 202 are shown, in accordance with the present invention. The error amplifier 202 in this embodiment is implemented as a differential amplifier (e.g., an operational amplifier or suitable alternative thereof) including a first or input differential stage comprised of two NMOS transistor devices 304 and 306, each device having a gate (G), a source (S) and a drain (D) terminal. The two transistor devices 304, 306 are coupled together in a differential pair configuration, with a common source or tail connection at node 312. The gate terminals of the transistor devices 304, 306 form non-inverting and inverting inputs, respectively, of the error amplifier 202. The drain terminals of each input transistor device 304, 306 are coupled to a corresponding input load 308. As will be appreciated by those skilled in the art, the input load 308 maybe implemented, for example, as a pair of resistors of substantially equal value, each resistor being connected at a first end to the drain terminal of a corresponding one of the input devices 304, 306, and to a positive voltage supply (e.g., $V_{IN}$) at a second end. Alternatively, the input load 308 maybe implemented, for example, using a pair of active devices (e.g., transistors) biased to an appropriate quiescent operating point. Various other load circuit arrangements are similarly contemplated by the present invention. An output 316 of the input stage of the error amplifier is formed in this embodiment at a junction between the drain terminal of transistor device 306 and a corresponding terminal of input load 308.

The input stage of the error amplifier 202 further includes a controlled current source 302 operatively coupled to the tail node 312 for supplying a bias current $I_{BIAS}$ to the input stage. The controlled current source 302 is responsive to a control signal (e.g., a control voltage or current) for selectively controlling the bias current $I_{BIAS}$ flowing through the input stage. Controlled current sources suitable for use with the present invention include voltage-controlled current sources (VCCS) and current-controlled current sources (CCCS), e.g., current differential amplifiers. A more detailed discussion of such controlled current sources may be found, for example, in the text by P. E. Allen and D. R. Holberg, *CMOS Analog Circuit Design*, Holt, Rinehart & Winston, pp. 308–313 (1987), which is incorporated herein by reference.

The error amplifier 202 in this embodiment further comprises a second stage 310 coupled to the output 316 of the input stage. This second stage 310 may be an output stage, assuming no subsequent amplifier stages are used (as shown in FIG. 3). As will be appreciated by those skilled in the art, a common characteristic inherent in many differential amplifiers is that they typically possess a large output impedance, which can be undesirable when driving small resistance and/or large capacitance loads. Consequently, the second stage 310 may be employed where it is advantageous to isolate the input stage of the error amplifier 202 from such external conditions or a subsequent amplifier stage. Moreover, the second stage 310 may, for instance, provide sufficient output power in the form of voltage or current. The second stage 310 may be configured to provide a predetermined gain, or it may provide unity gain consistent with a standard buffer circuit. The second stage 310 may also include level shifting circuitry for setting an output voltage of the error amplifier to a predetermined value, as necessary. An output of the second stage 310, if such a stage is employed, forms the overall output 214 of the error amplifier 202 for modulating the impedance of the pass transistor 206, as explained above.

The reference voltage source 208, which, as previously stated, generates a substantially constant voltage $V_{REF}$ (e.g., supply-independent and temperature-independent), is operatively coupled to the non-inverting input of the error amplifier 202. The inverting input of the error amplifier is operatively coupled to the measured voltage $V_M$, at node 210, corresponding to a predetermined portion of the output voltage $V_O$ of the regulator circuit 300. The value of the measured voltage $V_M$ can be determined using a simple voltage divider equation as follows:

$$V_M = V_O \cdot \frac{R1}{R1 + R2}$$

It is to be appreciated that the feedback circuit comprising the error amplifier 202 and the pass transistor 206 holds the measured voltage $V_M$ substantially equal to the reference voltage $V_{REF}$. Therefore, using the above equation, the resistors R1 and R2 can be selected to produce a desired regulated output voltage $V_O$ and/or quiescent pull-down current flowing through the resistor divider.

With continued reference to FIG. 3, the illustrative regulator circuit 300 further comprises current sense circuit 204 coupled to the output 214 of the error amplifier 202 for operatively monitoring a representative output (e.g., output load current) of the regulator circuit and generating the control signal 212 in response thereto. The control signal 212 is coupled to the controlled current source 302 in the error amplifier 202 and preferably provides a path for feeding back at least a portion of the output voltage or current supplied by the pass transistor 206 to dynamically control the bias current of the input stage of the error amplifier, as explained above in conjunction with FIG. 2.

The present invention contemplates that a load-dependent (dynamic) bias feedback architecture may be implemented in other functional sub-circuits of the regulator circuit 300 in addition to and consistent with the dynamic input stage biasing described herein. As shown in FIG. 3, the control signal on line 212 (or other signal which is a function of the regulator output) from the current sense circuit 204 may also be coupled to the input stage load 308 and/or the second stage 310 of the error amplifier 202. Each of these additional load-dependent bias current feedback paths may be similarly used to dynamically control one or more characteristics of the respective circuits to which such feedback path is coupled. For example, the second stage 3 may include a controlled current source (not shown) consistent with the controlled current source 302 included in the input stage of the error amplifier. Hence, the control signal may be used to dynamically increase a quiescent current in the second stage 310 when an increase in output load current is detected, or vice versa. In this manner the benefits of dynamic input stage biasing can be similarly applied to other functional sub-circuits in the regulator circuit 300.

Figure 4A:
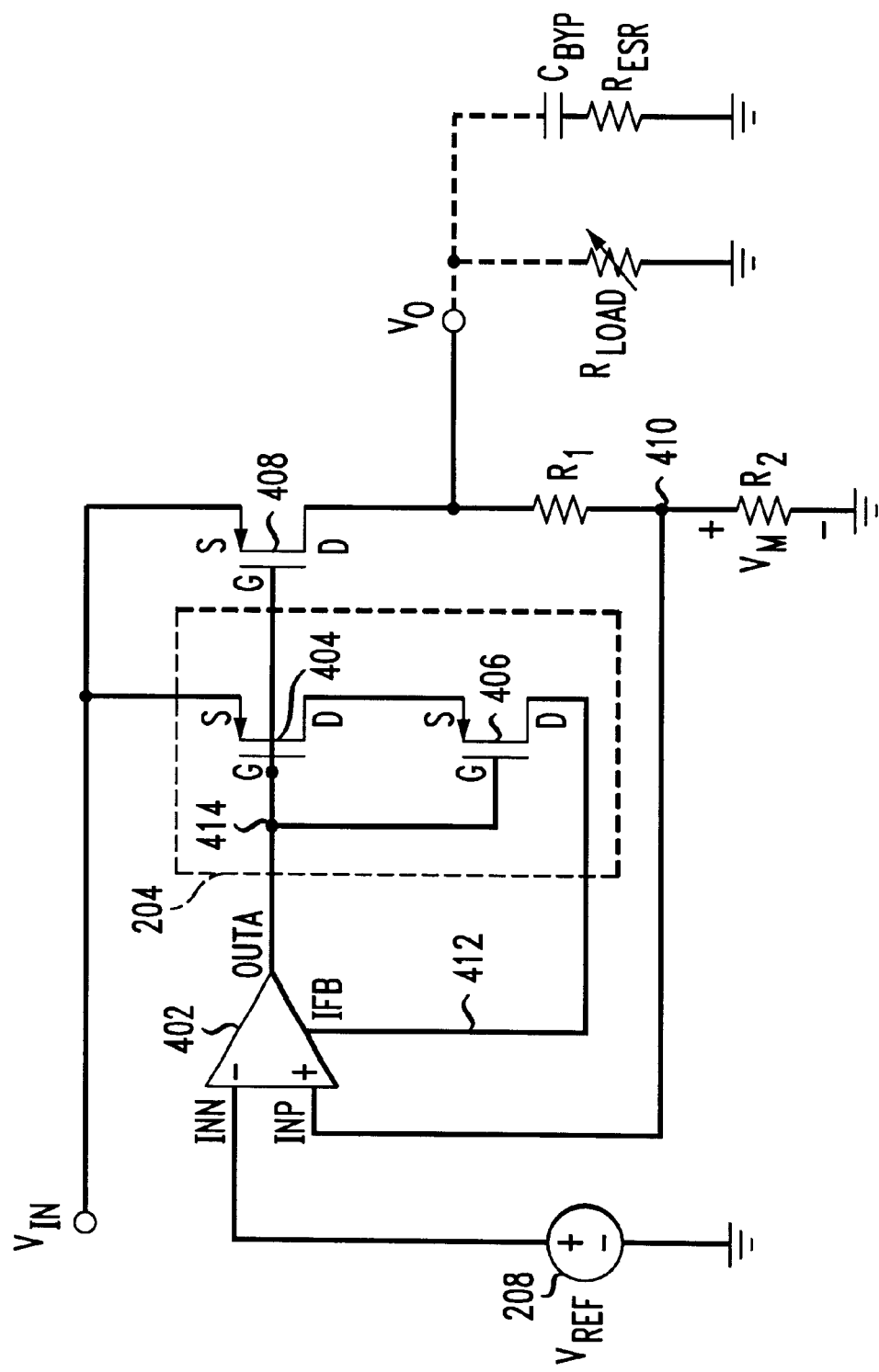
FIGS. 4A and 4B are schematic diagrams depicting an exemplary linear regulator circuit implementation, formed in accordance with the present invention.
Figure 4B:
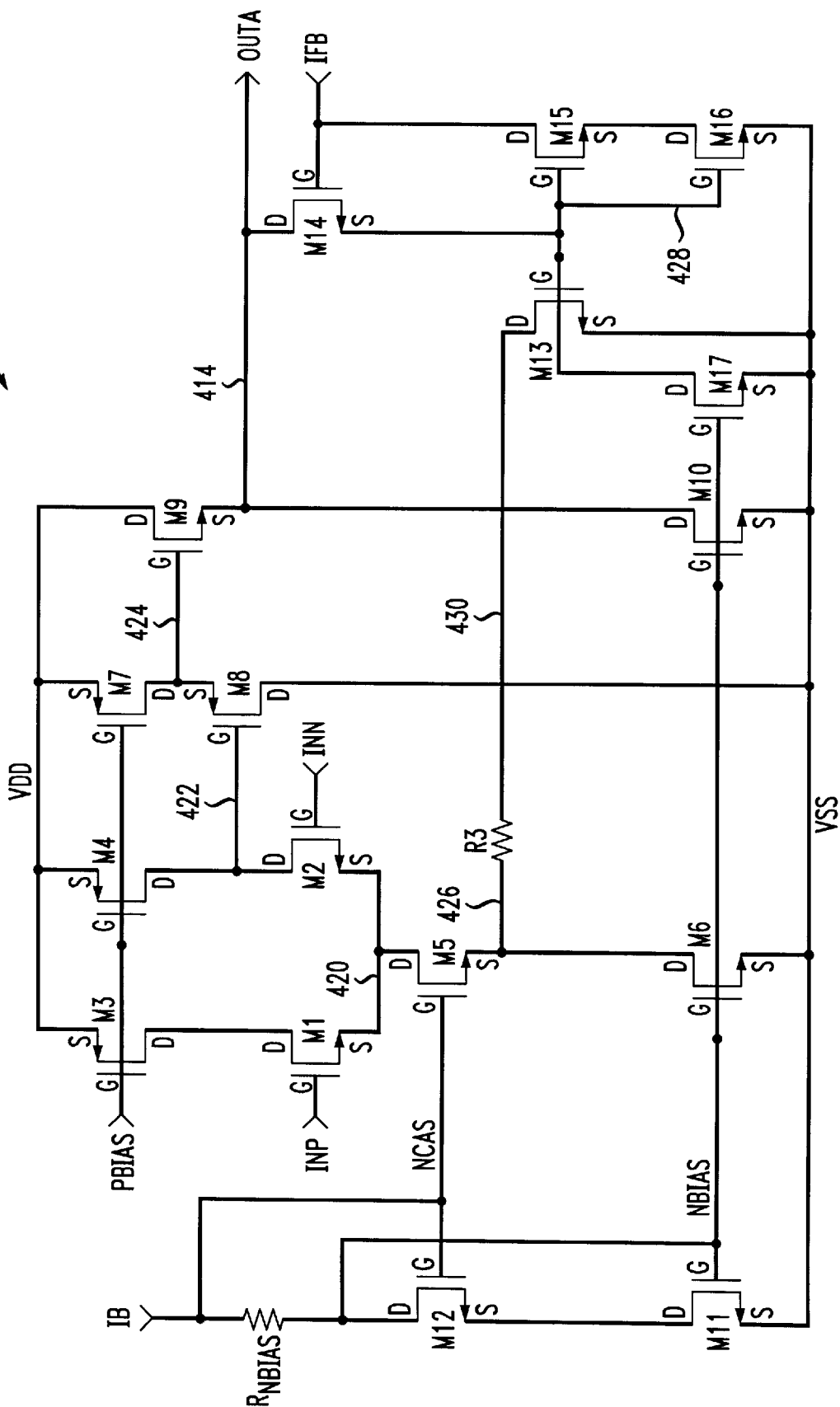

In FIG. 4A there is shown an exemplary linear regulator circuit formed in accordance with an illustrative embodiment of the invention. With reference to FIG. 4A, the exemplary regulator circuit 400 incorporates the dynamic input biasing architecture of the present invention. The regulator circuit 400 includes an error amplifier 402, details of which are shown in FIG. 4B, having an output 414 coupled to the gate (G) terminal of a PMOS transistor device 408 functioning as a pass element. An output voltage OUTA is developed at the output 414. The source (S) terminal of the pass transistor 408 is coupled to the unregulated input $V_{IN}$ of the regulator circuit 400 and the drain (D) terminal of transistor 408 forms a regulated output $V_O$ of the regulator circuit, in a manner similar to that previously explained in connection with FIG. 2. Voltage source 208 is coupled to an input of the error amplifier 402 (e.g., inverting input INN) and as previously noted supplies a reference voltage $V_{REF}$ that is ideally independent of supply voltage and temperature variations. The voltage reference 208 may be generated internal to the regulator 400, such as with a bandgap reference circuit. Similarly, such reference voltage $V_{REF}$ may be supplied from an external voltage source. It is to be appreciated that the input connections to the error amplifier 402 may be reversed, in which case the polarity type of pass transistor 408 could likewise be reversed (e.g., NMOS device) and transistor 408 would be used in a follower configuration to avoid a positive feedback condition, as will be understood by those skilled in the art.

The error amplifier 402 compares the reference voltage $V_{REF}$ with the measured voltage $V_M$ coupled to a second input of the error amplifier (e.g., non-inverting input INP), which as previously noted represents at least a portion of the regulator circuit output $V_O$, at node 4 and generates an error signal at the output 414 of the error amplifier in response to a difference between the two voltages $V_{REF}$ and $V_M$. As explained previously, the measured voltage $V_M$ may be derived from the regulator circuit output $V_O$ by means of a tapped voltage divider circuit, or a suitable alternative thereof. The voltage divider circuit preferably comprises two resistors R1 and R2 connected together in series across the regulated output $V_O$.

With continued reference to FIG. 4A, the current sense circuit 204 may be implemented, in accordance with one aspect of the invention, using a pair of PMOS transistor devices 404, 406. The two transistor devices 404, 406 are preferably connected in a stacked arrangement, with the gate terminals of each device coupled to the output 414 of the error amplifier 402 and the drain terminal of top transistor device 404 connected to the source terminal of bottom transistor device 406. The source terminal of the top device 404 is preferably connected to the unregulated input $V_{IN}$, along with the source terminal of the pass transistor 408. The drain terminal of the bottom transistor device 406 is coupled to a bias control input IFB of the error amplifier 402 via line 412. In this manner, the transistor devices 404, 406 sense the output voltage OUTA from the error amplifier and generate a voltage-dependent current through line 412 that is a function of an output load current supplied by the pass transistor 408. One skilled in the art will appreciate that other sense circuits (e.g., including voltage sense circuits) may be employed in implementing the present invention.

Ideally, the current sense circuit 204 is fabricated in close relative proximity to the pass transistor 408 on a semiconductor integrated circuit chip. For instance, the devices comprising the current sense circuit 204 may be constructed as part of transistor 408 itself. In this manner, the current sense circuit can closely match and/or track the electrical characteristics of pass transistor 408, for example, including temperature characteristics, impedance, noise performance, etc.

The output load of the regulator circuit 400 is represented as load resistor $R_{LOAD}$ and load capacitor $C_{BYP}$, having an equivalent series resistance $R_{ESR}$ associated therewith, connected in parallel with the load resistor $R_{LOAD}$. As noted previously, the load current sourced by the regulator may vary over a wide range, and therefore the load resistor is represented as a variable resistance element.

Referring now to FIG. 4B, an implementation of the error amplifier 402 of FIG. 4A is shown, in accordance with an illustrative embodiment of the invention. Similar to error amplifier 202 as described in conjunction with FIG. 3, error amplifier 402 includes an input stage comprising input NMOS transistor devices M1 and M2 connected in a differential pair configuration, with a common source or tail node at 420. The gate terminal of transistor M1 forms a non-inverting input INP of the error amplifier 402. Likewise, the gate terminal of transistor M2 forms an inverting input INN of the error amplifier. The drain terminal of each device M1 and M2 is coupled to a corresponding input load device, which is implemented as a pair of PMOS transistor devices M3 and M4, respectively. In order to bias the load devices M3, M4 to an appropriate operating point, the gate terminals of the load devices M3, M4 may be coupled to a bias voltage PBIAS. The bias voltage PBIAS may be generated internal to the error amplifier or it can be supplied to the error amplifier, for example, from an external reference source. The source terminals of the two load devices M3, M4 are connected to a positive supply VDD, which may be the unregulated input VIN.

The input stage of error amplifier 402 further comprises an input bias current source (tail current source) coupled to the tail node 420. The input bias current source in the illustrative error amplifier includes NMOS transistor devices M5 and M6 which are operatively coupled together in a cascode configuration. The gate terminals of devices M5 and M6 are coupled to corresponding cascode bias voltages at nodes NCAS and NBIAS, respectively. The drain termninal of transistor M5 is coupled to the tail node 4 and the source terminal of M5 is coupled to the drain terminal of transistor M6, the junction of which forms node 426. The source terminal of transistor M6 is connected to the negative supply VSS, which may be ground, for providing a bias current return path.

With continued reference to FIG. 4B, a suitable bias source for generating the NBIAS and NCAS voltages preferably comprises NMOS transistor devices M11 and M12, respectively, operatively coupled together in a cascode arrangement, consistent with devices M5 and M6. A bias resistor $R_{NBIAS}$ is coupled between node NBIAS and a reference voltage or current IB, connected to node NCAS. The bias current flowing through transistors M12 and M11 can be selected either by choosing an appropriate reference current IB or by choosing a desired reference voltage and resistance value for $R_{NBIAS}$. Node NBIAS is formed as a junction of the gate terminal of device M11 and the drain terminal of device M12. Node NCAS is coupled to the gate terminal of transistor M12. The source terminal of transistor M12 is coupled to the drain terminal of transistor M11 and the source terminal of M11 is connected to the negative supply VSS. It is to be appreciated that other bias circuits, either internal or external to the error amplifier, may be similarly employed, as understood by those skilled in the art.

The illustrative error amplifier 402 further comprises an output stage including PMOS transistor device M8 and NMOS transistor device M9, configured as source-followers. Transistor devices M7 and M10 are operatively coupled to the source terminals of source-follower devices M8 and M9, respectively, and function as current source loads for establishing an operating point of the respective output devices M8, M9. The gate terminal of device M7 is coupled to node PBIAS for supplying a predetermined bias current to output device M8. The source terminal of M8 is coupled to the drain terminal of M7 at node 424 and the drain terminal of M8 is connected to the negative supply VSS for providing a current return path. Similarly, the gate terminal of transistor M10 is coupled to node NBIAS for supplying a predetermined bias current to output device M9. The drain terminal of device M10 is coupled to the source terminal of device M9, the junction of which forms the output 414 of the error amplifier 402. The gate terminal of device M8 is coupled to an output of the input stage at node 422. It is to be appreciated that load devices M7 and M10 may be replaced by corresponding resistors, for example, having a resistance selected to bias the transistor devices M8 and M9, respectively, to a desired operating point.

As shown in FIG. 4B, the error amplifier 402 further includes a current feedback control circuit comprising NMOS transistor devices M13 through M17 and resistor R3. The current feedback control circuit includes input IFB, forming a bias control input of the error amplifier, coupled to the gate terminal of transistor M14 and the drain terminal of device M15, for receiving an input bias control signal presented to the error amplifier. The drain terminal of transistor device M14 is preferably coupled to the output 414 of the error amplifier and the source terminal of device M14 is coupled to a junction of the gate terminals of transistors M13, M15 and M16 at node 428. A pull-down device M17 provides a current path for device M14, at least in part for establishing a predetermined voltage at node 428. Device M17 also prevents node 428 from drifting to an undetermnined level in the event transistor M14 is turned off. The source terminal of transistor M15 is coupled to the drain terminal of transistor M16, and the source terminal of M16 is connected to the negative supply VSS. Transistor M13 is operatively connected so that its drain terminal is coupled to the input bias current source (M5, M6) at node 426 through series-connected resistor R3 and its source terminal is connected to the negative supply VSS. The junction of transistor M13 and resistor R3 forms an output of the current feedback control circuit at node 430.

As explained herein above, the current feedback control arrangement functions to control, at least in part, the input bias current of the error amplifier 402 in response to the input bias control signal, which is a function of the output load current of the regulator circuit. Thus, in the error amplifier 402 the current feedback control circuit, in combination with the input bias current source (M5, M6) is an implementation of the controlled current source 302 shown in FIG. 3.

Transistor M14 functions as a source follower, whereby a voltage presented to the input IFB (gate terminal of M14) of the error amplifier is transferred to the gate terminal of transistor M13 at node 428, minus a gate-to-source voltage drop $V_{GS}$ of device M14. The voltage drop $V_{GS}$ of device M14 will vary depending primarily upon the current flowing through the device. This current may be controlled by appropriately sizing device M17, as understood by those skilled in the art. As the voltage at the gate terminal of device M13 increases, the current flowing into the drain terminal of M13 increases accordingly. This in turn sinks more current from node 426, thereby increasing the bias current of the input stage of the error amplifier 402. In a similar manner, as the voltage presented to input IFB decreases, the bias current of the input stage decreases.

The present invention thus provides an amplifier having dynamic input stage biasing by feeding back a voltage or current representative of an output load current of the amplifier to an input stage of the amplifier. In accordance with the invention, a bandwidth and bias current level of the input stage of the amplifier are functions of the output load current of the amplifier. Using the techniques described herein, the amplifier of the present invention can offer superior bandwidth and stability, particularly at low (or no) output current levels, while dissipating a minimized quiescent current. Furthermore, it is contemplated that the present invention may be fabricated, in whole or in part, as an integrated circuit device, either alone or in combination with other functional sub-circuits, using any suitable semiconductor fabrication process, including, for example, CMOS, bipolar, etc.

Although illustrative embodiments of the present invention have been described herein with reference to the accompanying drawings, it is to be understood that the invention is not limited to those precise embodiments, and that various other changes and modifications maybe affected therein by one skilled in the art without departing from the scope or spirit of the invention.

What is claimed is:

1. An amplifier having dynamic input stage biasing, the amplifier comprising:

an input stage operatively coupled to an input of the amplifier;

a controlled current source operatively coupled to the input stage, the controlled current source-being responsive to a control signal for at least partially controlling an input bias current generated by the controlled current source;

an output device operatively coupled to an output of the amplifier, the output device supplying an output load current at least when the amplifier is loaded which is responsive to an input signal presented to the output device; and a sense circuit operatively connected in a feedback arrangement between the output device and the controlled current source, the sense circuit measuring at least a portion of the input signal presented to the output device and generating the control signal that is representative thereof;

whereby the input bias current is dynamically controlled as a function of the input signal presented to the output device.

2. An amplifier having dynamic input stage biasing, the amplifier comprising:

a controlled current source being responsive to a control signal for at least partially controlling an input bias current generated by the controlled current source;

an input stage comprising a differential pair including first and second active devices, each active device being operatively coupled to first and second inputs, respectively, of the amplifier, the active devices being operatively coupled to the controlled current source at a tail node; and an input load operatively coupled to the differential pair; and a sense circuit operatively connected in a feedback arrangement between an output of the amplifier and the controlled current source, the sense circuit measuring an output load current from the amplifier and generating the control signal in response thereto;

whereby the input bias current is a function of the output load current of the amplifier.

3. The amplifier of claim 2, wherein the input load includes an input for receiving a second control signal for controlling a current flowing through the input load in response thereto, whereby the current flowing through the input load is a function of the output load current of the amplifier.

4. The amplifier of claim 2, wherein the differential pair comprises first and second NMOS transistors, each transistor having a gate terminal, a source terminal and a drain terminal, the source terminals of the first and second transistors being connected together and forming the tail node, the gate terminals of the first and second transistors forming the first and second inputs, respectively, of the amplifier, and the drain terminals of the first and second transistors being operatively coupled to the input load.

5. The amplifier of claim 1, wherein:

the control signal is at least a portion of the output load current; and the control signal is operatively summed with a current generated by the controlled current source.

6. An amplifier having dynamic input stage biasing, the amplifier comprising:

an input stage operatively coupled to an input of the amplifier;

a controlled current source operatively coupled to the input stage, the controlled current source being responsive to a control signal for at least partially controlling an input bias current generated by the controlled current source;

a sense circuit operatively connected in a feedback arrangement between an output of the amplifier and the controlled current source, the sense circuit measuring an output load current from the amplifier and generating the control signal in response thereto; and a second stage including a first input coupled to the input stage of the amplifier, a second input for receiving a second control signal, and an output coupled to the output of the amplifier, the second stage being responsive to the second control signal for controlling a current flowing through the second stage;

whereby the current flowing through the second stage and the input bias current are functions of the output load current of the amplifier.

7. The amplifier of claim 1, wherein the controlled current source comprises first and second transistors operatively coupled together in a cascode configuration, the first and second transistors forming a common cascode node that is coupled to the control input.

8. An amplifier having dynamic input stage biasing, the amplifier comprising:

an input stage operatively coupled to an input of the amplifier;

a controlled current source operatively coupled to the input stage, the controlled current source being responsive to a control signal for at least partially controlling an input bias current generated by the controlled current source, wherein the controlled current source comprises first and second NMOS transistors, each transistor having a gate terminal, a source terminal and a drain terminal, the drain terminal of the first transistor being connected to the input stage, the source terminal of the first transistor being connected to the drain terminal of the second transistor and to the control signal, the source terminal of the second transistor being connected to a current return of the amplifier, the gate terminals of the first and second transistors being coupled to first and second bias voltages, respectively; and a sense circuit operatively connected in a feedback arrangement between an output of the amplifier and the controlled current source, the sense circuit measuring an output load current from the amplifier and generating the control signal in response thereto;

whereby the input bias current is a function of the output load current of the amplifier.

9. The amplifier of claim 1, wherein the amplifier is fabricated in an integrated circuit.

10. A regulator circuit including an unregulated input and a regulated output and having dynamic input stage biasing, the regulator comprising:

an error amplifier including first and second inputs and an output, the error amplifier including an input stage operatively coupled to the first and second inputs of the error amplifier, and a controlled current source operatively coupled to the input stage, the controlled current source being responsive to a control signal for at least partially controlling an input bias current generated by the controlled current source, the error amplifier generating an error signal in response to a difference between a reference voltage coupled to the first input of the error amplifier and a measured voltage representing at least a portion of the regulated output of the regulator;

a pass device having a first terminal coupled to the unregulated input of the regulator, a second terminal coupled to the regulated output of the regulator, and a third terminal coupled to the output of the error amplifier, the pass device receiving the error signal and controlling a voltage drop between the first and second terminals of the pass device in response thereto;

a sense circuit operatively connected in a feedback configuration between the output of the regulator and the controlled current source in the error amplifier, the sense circuit measuring an output load current from the regulator and generating the control signal in response thereto;

whereby the input bias current of the error amplifier is a function of the output load current of the regulator.

11. The regulator of claim 10, wherein the input stage comprises:

a differential pair including first and second active devices, each active device being operatively coupled to the first and second inputs, respectively, of the error amplifier, the active devices being operatively coupled to the controlled current source at a tail node; and an input load operatively coupled to the differential pair.

12. The regulator of claim 11, wherein:

the input load includes an input for receiving a second control signal for controlling a current flowing through the input load in response thereto;

whereby the current flowing through the input load is a function of the output load current of the regulator.

13. The regulator of claim 10, wherein the sense circuit comprises first and second PMOS transistors, each transistor having a gate terminal, a source terminal and a drain terminal, the gate terminals of the first and second transistors being coupled to the output of the error amplifier, the source terminal of the first transistor being connected to the unregulated input, the drain terminal of the first transistor being connected to the source terminal of the second transistor, and the drain terminal of the second transistor being operatively coupled to the controlled current source.

14. The regulator of claim 10, wherein:
the control signal is at least a portion of the output load current of the regulator; and
the control signal is operatively summed with a current generated by the controlled current source.

15. The regulator of claim 10, further comprising:
a second stage including a first input coupled to the input stage of the error amplifier, a second input for receiving a second control signal, and an output coupled to the output of the error amplifier, the second stage being responsive to the second control signal for controlling a current flowing through the second stage;
whereby the current flowing through the second stage is a function of the output load current of the regulator.

16. The regulator of claim 10, wherein the regulator is fabricated in an integrated circuit.

17. A method of reducing quiescent current of an amplifier, the method comprising the steps of:
sensing a signal presented to an output device associated with the amplifier, the output device supplying an output current from the amplifier, at least when the amplifier is loaded, which varies in response to the signal presented to the output device;
generating a control signal that is representative of at least a portion of the signal presented to the output device; and
controlling an input bias current flowing through an input stage of the amplifier in response to the control signal;
whereby the input bias current is dynamically controlled as a function of the signal presented to the output device.

18. The method of claim 17, wherein the step of controlling the input bias current of the amplifier comprises feeding back at least a portion of an output load current of the amplifier to the input stage.

19. The method of claim 17, further comprising the steps of:
dynamically controlling a bias current flowing through an input load operatively coupled to the input stage of the amplifier in response to the control signal.

20. The method of claim 17, further comprising the steps of:
dynamically controlling a bias current flowing through a second stage operatively coupled to the input stage of the amplifier in response to the control signal.

21. An integrated circuit including an amplifier comprising:
an input stage operatively coupled to an input of the amplifier;
a controlled current source operatively coupled to the input stage, the controlled current source being responsive to a control signal for at least partially controlling an input bias current generated by the controlled current source;
an output device operatively coupled to an output of the amplifier, the output device supplying an output load current, at least when the amplifier is loaded, which varies in response to an input signal presented to the output device; and
a sense circuit operatively connected in a feedback arrangement between the output device and the controlled current source, the sense circuit measuring at least a portion of the input signal presented to the output device and generating the control signal that is representative thereof;
whereby the input bias current is dynamically controlled as a function of the input signal presented to the output device.

22. The integrated circuit of claim 21, wherein the input stage comprises:
a differential pair including first and second active devices, each active device being operatively coupled to first and second inputs, respectively, of the amplifier, the active devices being operatively coupled to the controlled current source at a tail node; and
an input load operatively coupled to the differential pair.

23. An integrated circuit including an amplifier comprising:
a controlled current source being responsive to a control signal for at least partially controlling an input bias current generated by the controlled current source;
an input stage comprising a differential pair including first and second active devices, each active device being operatively coupled to first and second inputs, respectively, of the amplifier, the active devices being operatively coupled to the controlled current source at a tail node; and an input load operatively coupled to the differential pair; and
a sense circuit operatively connected in a feedback arrangement between an output of the amplifier and the controlled current source, the sense circuit measuring an output load current from the amplifier and generating the control signal in response thereto;
wherein the input load includes an input for receiving a second control signal for controlling a current flowing through the input load in response thereto, whereby the current flowing through the input load and the input bias current are functions of the output load current of the amplifier.

24. An integrated circuit including an amplifier comprising:
an input stage operatively coupled to an input of the amplifier;
a controlled current source operatively coupled to the input stage, the controlled current source being responsive to a control signal for at least partially controlling an input bias current generated by the controlled current source;
a sense circuit operatively connected in a feedback arrangement between an output of the amplifier and the controlled current source, the sense circuit measuring an output load current from the amplifier and generating the control signal in response thereto; and
a second stage including a first input coupled to the input stage of the amplifier, a second input for receiving a second control signal, and an output coupled to the output of the amplifier, the second stage being responsive to the second control signal for controlling a current flowing through the second stage;
whereby the input bias current and the current flowing through the second stage are functions of the output load current of the amplifier.

25. An integrated circuit including an unregulated input and a regulated output, the integrated circuit comprising:

an error amplifier including first and second inputs and an output, the error amplifier comprising an input stage operatively coupled to the first and second inputs of the error amplifier, and a controlled current source operatively coupled to the input stage, the controlled current source being responsive to a control signal for at least partially controlling an input bias current generated by the controlled current source, the error amplifier generating an error signal in response to a difference between a reference voltage coupled to the first input of the error amplifier and a measured voltage representing at least a portion of the regulated output of the integrated circuit;

a pass device having a first terminal coupled to the unregulated input of the integrated circuit, a second terminal coupled to the regulated output of the integrated circuit, and a third terminal coupled to the output of the error amplifier, the pass device receiving the error signal and controlling a voltage drop between the first and second terminals of the pass device in response thereto;

a sense circuit operatively connected in a feedback configuration between the regulated output of the integrated circuit and the controlled current source in the error amplifier, the sense circuit measuring an output load current from the integrated circuit and generating the control signal in response thereto;

whereby the input bias current of the error amplifier is a function of the output load current of the integrated circuit.

26. The integrated circuit of claim 25, wherein the input stage comprises:

a differential pair including first and second active devices, each active device being operatively coupled to the first and second inputs, respectively, of the error amplifier, the active devices being operatively coupled to the controlled current source at a tail node; and an input load operatively coupled to the differential pair.

27. The integrated circuit of claim 26, wherein:

the input load includes an input for receiving a second control signal for controlling a current flowing through the input load in response thereto;

whereby the current flowing through the input load is a function of the output load current of the integrated circuit.

28. The integrated circuit of claim 25, further comprising:

a second stage including a first input coupled to the input stage of the error amplifier, a second input for receiving a second control signal, and an output coupled to the output of the error amplifier, the second stage being responsive to the second control signal for controlling a current flowing through the second stage;

whereby the current flowing through the second stage is a function of the output load current of the integrated circuit.

* * * * *